US007868802B2

(12) United States Patent
Straeussnigg et al.

(10) Patent No.: US 7,868,802 B2
(45) **Date of Patent: *Jan. 11, 2011**

(54) QUANTIZATION ERROR REDUCTION IN PWM FULL-MASH CONVERTERS

(75) Inventors: Dietmar Straeussnigg, Villach (AT); Luis Hernandez, Madrid (ES); Andreas Wiesbauer, Poertschach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/418,633

(22) Filed: Apr. 6, 2009

(65) Prior Publication Data

US 2009/0189795 A1 Jul. 30, 2009

Related U.S. Application Data

(63) Continuation of application No. 11/923,550, filed on Oct. 24, 2007, now Pat. No. 7,659,842.

(51) Int. Cl.
*H03M 3/00* (2006.01)

(52) U.S. Cl. ........................ 341/143; 341/118; 341/155

(58) Field of Classification Search ................. 341/118, 341/143

See application file for complete search history.

(56) References Cited

U.S. PATENT DOCUMENTS 5,471,209 A * 11/1995 Sutterlin et al. ............. 341/143
5,838,272 A 11/1998 Steiner et al.
5,959,562 A * 9/1999 Wiesbauer .................. 341/143
6,008,703 A 12/1999 Perrott et al.
6,016,112 A 1/2000 Knudsen
6,369,730 B1 4/2002 Blanken et al.
6,414,613 B1 7/2002 Midya et al.
6,741,197 B1 5/2004 Melanson
6,750,795 B2 * 6/2004 Gupta ........................ 341/143
6,839,387 B1 * 1/2005 Mittel ........................ 375/247
7,006,762 B2 2/2006 Baskin
7,123,101 B2 10/2006 Puma et al.

FOREIGN PATENT DOCUMENTS

DE 4333908 A1 4/1995
DE 10233391 C1 12/2003
EP 1229641 A1 8/2002

OTHER PUBLICATIONS

Bresch et al, "TMS320C67-Based Design of a Digital Audio Power Amplifier Introducing Novel Feedback Strategy," Rose-Hulman Institute of Technology, Electrical and Computer Engineering Department, no date (available at least as early as Sep. 12, 2007), pp. 1-16.
Lampton et al, "A high-speed wide dynamic range time-to-digital converter," Review of Scientific Instruments, vol. 65, No. 11, Nov. 1994, pp. 3577-3584.
Markus et al, "An Efficient Delta-Sigma Noise-Shaping Architecture for Wideband Applications," 4th International Conference on Advanced A/D and D/A Conversion Techniques and Their Applications & 7th European Workshop on ADC Modelling and Testing (ADDA-EWADC'2002), Prague, Jun. 26-28, 2002, pp. 35-38.
Erickson, "A Fundamental Introduction to the Compact Disc Player", Department of Electrical Engineering University of Minnesota, Nov. 29, 1994, EE 3011, Professor: Dr. Kevin M. Buckley, pp. 1-19, http://www.tc.umn.edu/~erick205/Papers/3011Paper.pdf.
Holme, "15-25 MHz Fractional-N Synthesizer", Mash (Multi-stAge noise SHaping) structure, copyright by Andrew Holme, 2005, pp. 1-4 http://www.holmea.demon.co.uk/Frac2/Mash.htm.
Holme, "Fractional-N Frequency Synthesizer", Mash Sequence, copyright by Andrew Holme, 2004, pp. 1-4 http://www.holmea.demon.co.uk/FracN/Simulate.htm.

* cited by examiner

*Primary Examiner*—Khai M Nguyen
(74) *Attorney, Agent, or Firm*—SpryIP, LLC

(57) ABSTRACT

Techniques for reducing quantization error in electronic components are described herein.

14 Claims, 3 Drawing Sheets

QUANTIZATION ERROR REDUCTION IN PWM FULL-MASH CONVERTERS

CROSS-REFERENCE TO RELATED APPLICATIONS/PRIORITY CLAIM

This patent application is related to co-pending, commonly-owned U.S. patent application Ser. No. 11/923,494 entitled "Sampling Error Reduction in PWM-MASH Converters" and filed on October 24, which Application is incorporated herein by reference.

This patent application is a continuation application of pending U.S. patent application Ser. No. 11/923,550, which was filed on Oct. 24, 2007. The priority of the U.S. patent application Ser. No. 11/923,550 is hereby claimed and the contents of the Application are hereby incorporated herein by reference.

BACKGROUND

Converters for converting analog signals to digital signals and vice versa are found in a wide variety of circuits and devices, including compact disc (CD) players, digital video disc (DVD) players, signal processors, and various other systems that communicate signals. In general, the accuracy and quality of the signal conversion process increases with increasing sampling rate provided that noise introduced by the digitization process (i.e., sampling and quantization) is properly taken into consideration.

Multi-stage noise shaping (MASH) converters (also termed Full-MASH converters) are frequently used to separate and remove noise inherently introduced by digitization. Typically, as the number of noise-shaping stages of a MASH converter increases, the quality of the desired signal also increases. MASH converters are particularly useful for applications in which oversampling is used, such as in certain pulse-width-modulation (PWM) converters. The term oversampling refers to the use of sampling frequencies that exceed a frequency dictated by the Nyquist theorem in order to boost signal-to-noise ratio and reduce quantization noise.

Unfortunately, as the number of noise-shaping stages (i.e., the order of the MASH converter) increases, power consumption and surface area requirements also increase.

BRIEF DESCRIPTION OF THE DRAWINGS

The detailed description is described with reference to the accompanying figures. The use of the same reference numbers in different instances in the description and the figures may indicate similar or identical items.

DETAILED DESCRIPTION

Disclosed herein are improved techniques for reducing quantization noise introduced by digitization processes in electronic components, including pulse width modulation (PWM) full multi-stage noise shaping (MASH) converters. In general, techniques in accordance with the present disclosure may advantageously reduce quantization noise, allowing electronic components to operate effectively at reduced sampling rates, with corresponding reductions in power consumption, surface area requirements, and fabrication costs in comparison with conventional noise shaping techniques.

In general, implementations in accordance with the present disclosure measure a quantization error introduced by a digitization process, and remove the quantization error from the digital output signal. As described more fully below, since the error introduced by the entire digitization process (i.e., quantization and digitization) is measured, implementations in accordance with the present disclosure may account for possible non-linearities due to quantization in PWM Full-MASH conversion processes. The reduction of quantization noise advantageously allows electronic components to operate effectively at reduced sampling rates, with corresponding reductions in power consumption and improvements in the area of dynamics and the output signal amplitudes. Implementations in accordance with the present disclosure may allow analog-to-digital converters to operate with very high dissolution which has been virtually unrealizable up to now. Thus, substantial advantages in operational performance and fabrication costs of electronic components may be achieved by removal of the quantization error in accordance with the teachings of the present disclosure.

Techniques for reducing quantization noise introduced by a digitization process in accordance with the present disclosure may be implemented in a number of ways. One example environment and context is provided below with reference to the included figures and the on going discussion.

Exemplary Systems

Figure 1:
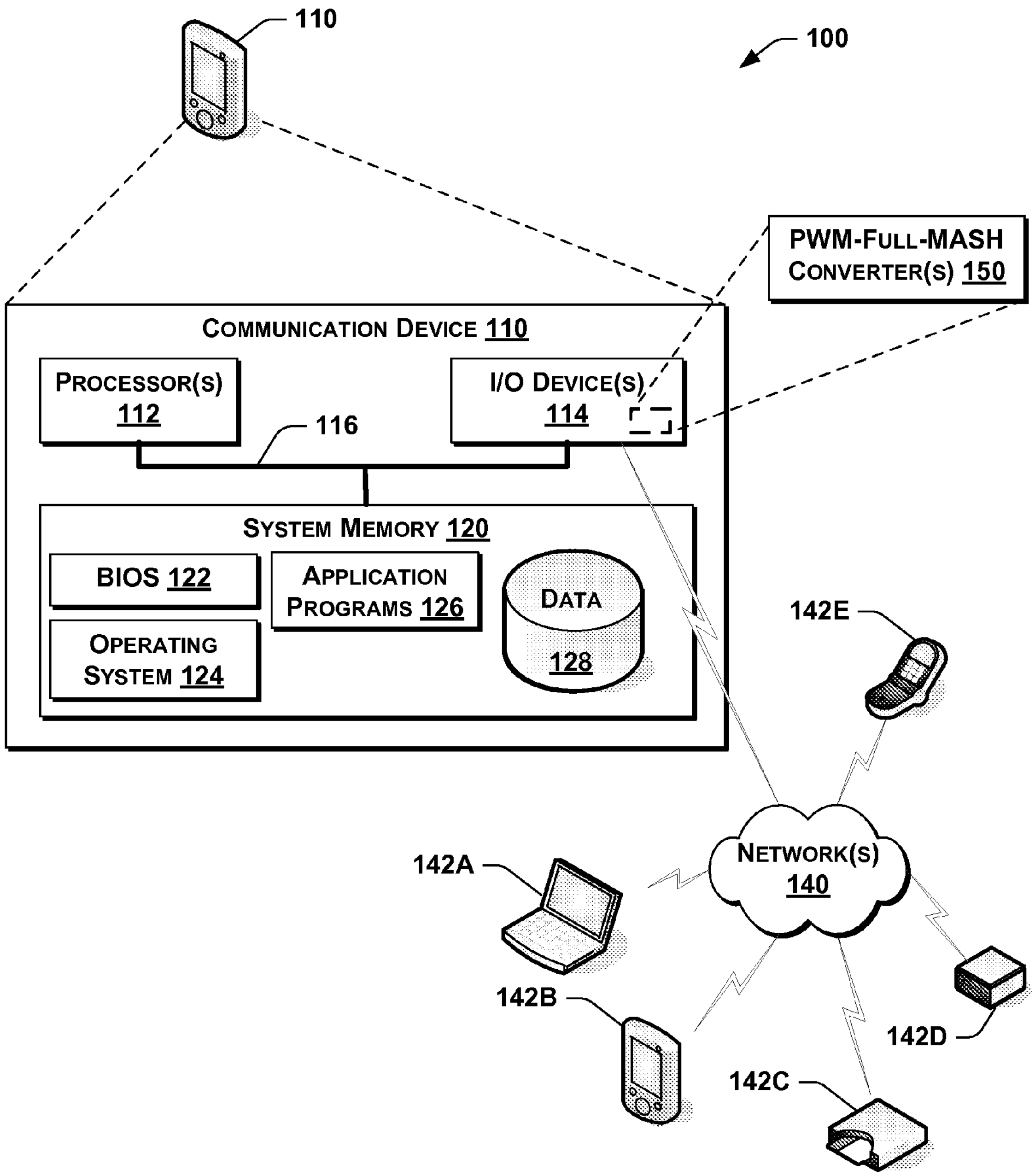
FIG. 1 is an exemplary environment in which techniques in accordance with the present disclosure may be implemented.

FIG. 1 illustrates an exemplary environment 100 in which techniques in accordance with the present disclosure may be implemented. In this implementation, the environment 100 includes a communication device 110 having one or more pulse-width modulation (PWM) full multi-stage noise shaping (MASH) converters 150 configured in accordance with the teachings of the present disclosure. The communication device 110 operatively communicates via one or more networks 140 with a plurality of other devices 142. Alternatively, the communication device 110 may bypass the networks 140 and communicate directly with one or more of the other devices 142. Detailed descriptions of various aspects of the PWM-Full-MASH converter 150 are provided in the following sections with reference to FIGS. 2 through 6.

In the representative environment 100, the communication device 110 is a hand-held device, such as an MP3 (Moving Picture Exerts Group Layer-3) player, a personal data assistant (PDA), a global positioning system (GPS) unit, or other similar hand-held device, and the other devices 142 may include, for example, a computer 142A, another hand-held device 142B, a compact disc (CD) or digital video disc (DVD) player 142C, a signal processor 142D (e.g., radio, navigational unit, television, etc.), and a cell phone 142E. In alternate implementations, of course, the devices 110, 142 may include any other suitable devices, and it is understood that any of the plurality of devices 142 may be equipped with PWM-MASH converters 150 that operate in accordance with the teachings of the present disclosure.

As further shown in FIG. 1, the communication device 110 includes one or more processors 112 and one or more input/output (I/O) devices 114 (e.g., transceivers, transmitters, receivers, etc.) coupled to a system memory 120 by a bus 116. In the implementation shown in FIG. 1, the PWM-Full-MASH converter 150 is included as a component within the I/O devices 114 of the communication device 110. In alternate implementations, however, the PWM-Full-MASH converter 150 may be integrated with any other suitable portion of the device 110, or may be a separate, individual component of the device 110.

The system bus 116 of the communication device 110 represents any of the several types of bus structures, including a memory bus or memory controller, a peripheral bus, an accelerated graphics port, and a processor or local bus using any of a variety of bus architectures. The I/O component 114 may be configured to operatively communicate with one or more external networks 140, such as a cellular telephone network, a satellite network, an information network (e.g., Internet, intranet, cellular network, cable network, fiber optic network, LAN, WAN, etc.), an infrared or radio wave communication network, or any other suitable network.

The system memory 120 may include computer-readable media configured to store data and/or program modules for implementing the techniques disclosed herein that are immediately accessible to and/or presently operated on by the processor 112. For example, the system memory 120 may also store a basic input/output system (BIOS) 122, an operating system 124, one or more application programs 126, and program data 128 that can be accessed by the processor 112 for performing various tasks desired by a user of the communication device 110.

Moreover, the computer-readable media included in the system memory 120 can be any available media that can be accessed by the device 110, including computer storage media and communication media. Computer storage media may include both volatile and nonvolatile, removable and non-removable media implemented in any method or technology for storage of information such as computer-readable instructions, data structures, program modules, or other data. Computer storage media includes, but is not limited to, and random access memory (RAM), read only memory (ROM), electrically erasable programmable ROM (EEPROM), flash memory or other memory technology, compact disk ROM (CD-ROM), digital versatile disks (DVD) or other optical disk storage, magnetic cassettes, magnetic tape, magnetic disk storage or other magnetic storage devices, or any other medium, including paper, punch cards and the like, which can be used to store the desired information and which can be accessed by the communication device 110.

Similarly, communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection and wireless media such as acoustic, RF, infrared and other wireless media. Combinations of any of the above should also be included within the scope of computer readable media.

Generally, program modules executed on the device 110 (FIG. 1) may include routines, programs, objects, components, data structures, etc., for performing particular tasks or implementing particular abstract data types. These program modules and the like may be executed as a native code or may be downloaded and executed such as in a virtual machine or other just-in-time compilation execution environments. Typically, the functionality of the program modules may be combined or distributed as desired in various implementations.

Although the exemplary environment 100 is shown as in FIG. 1 as a communication network, this implementation is meant to serve only as a non-limiting example of a suitable environment for use of the PWM-Full-MASH converter 150 in accordance with present disclosure. Similarly, the device 110 is simply one non-limiting example of a suitable device that may include PWM-Full-MASH converters 150 in accordance with the present disclosure.

Multi-Stage Noise Shaping (MASH) Converters

Figure 2:
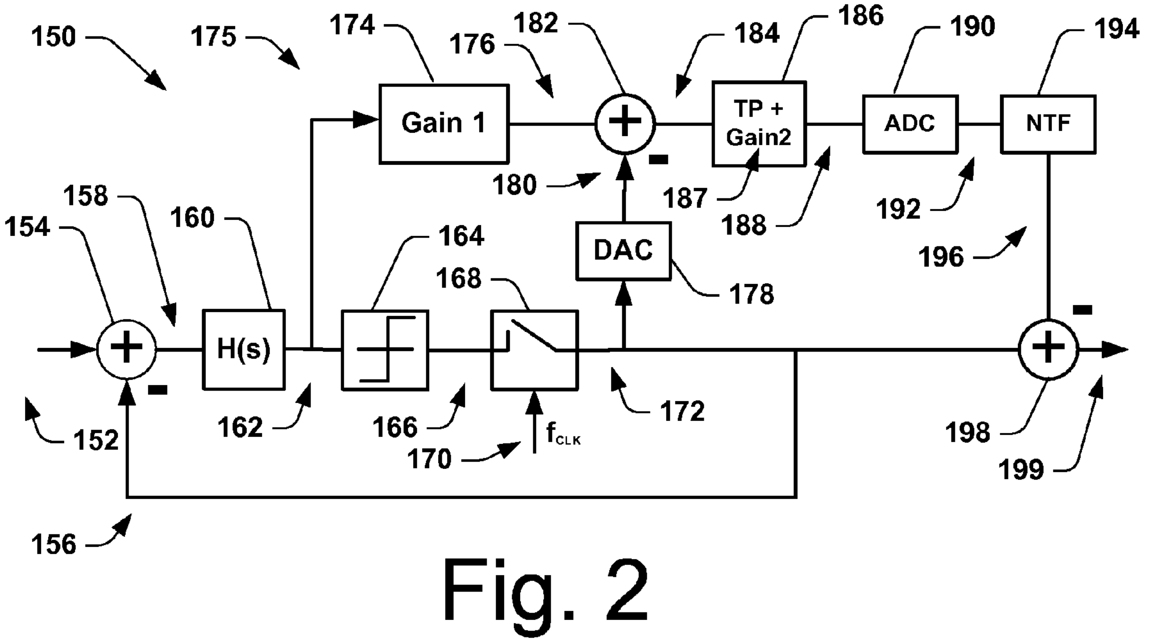
FIG. 2 is an exemplary pulse width modulation (PWM) multi-stage noise shaping (MASH) converter in accordance with an implementation of the disclosure.

Structural and operational aspects of implementations of pulse width modulation (PWM) full multi-stage noise shaping (MASH) converters in accordance with the present disclosure will now be described. For example, a PWM-Full-MASH converter 150 in accordance with an implementation of the present disclosure is shown in FIG. 2. In this implementation, the PWM-Full-MASH converter 150 is an analog to digital converter.

As shown in FIG. 2, an input analog signal 152 arrives at a first combiner (or combining component) 154 which combines a feedback signal 156 with the input analog signal 152. In some embodiments, the first combiner 154 may be a summing (or differencing) component which adds (or subtracts) the feedback signal 156 from the input analog signal 152. In other embodiments, the first combiner 154 may combine these signals in other desired ways. A resulting signal 158 from the first combiner 154 is provided to a filter 160 (or signal-shaping component) having a design described by a complex transfer function H(s) in the Laplace plane. The complex transfer function H(s) should be viewed as a representative function, and it will be appreciated that in alternate embodiments, other complex transfer functions may be used to describe the operation of the filter 160. The filter 160 may be a low-pass filter, or other suitable asynchronous, unstable filter. In particular implementations, the filter 160 may be a MASH component having any suitable number of stages (i.e., order M=1, 2, . . . N).

A shaped signal 162 from the filter 160 is received by a first gain 174 of a measuring loop 175. The first gain 174 corresponds to the so-called equivalent reinforcement factor of a non-linear quantizer (introduced below) in accordance with the theory of "harmonic balance." The shaped signal 162 is used by the measuring loop 175 to measure the error introduced by a digitization process. In a particular implementation, an analog difference formulation of the measuring loop 175 induces a single-bit digital-to-analog conversion, as described more fully below.

As further shown in FIG. 2, the shaped signal 162 from the filter 160 is also output to a comparator 164. The comparator 164 (or other suitable analyzer) provides a comparator output 166 based on the shaped signal 162. For example, in some implementations, as described more fully in co-pending, commonly-owned application DE 10233391 by Laaser Peter, incorporated herein by reference, the comparator output 166 may assume a value as follows: comparator output 166=A for shaped signal 162 greater than or equal to zero; and comparator output 166=b for shaped signal 162 less than zero. In a particular embodiment, A=1 and b=−1 when the analog input signal 152 is within a range from −1 to 1, inclusive (i.e., −1≦the analog input signal 152≦1).

The comparator output 166 is received by a sampling component 168. The sampling component 168 performs a time discretization on the comparator output 166 based on a sampling frequency (or $f_{CLK}$) 170 to provide a digitized output 172. The digitized output 172 is fed back as the feedback signal 156 to the first combiner 154.

As further shown in FIG. 2, the digitized output 172 is also provided to a digital-to-analog converter (DAC) 178, which converts the digitized output 172 to an intermediate analog signal 180. A second combiner 182 of the measuring loop 175 provides an analog result 184 by combining the intermediate analog signal 180 and a gained signal 176 output by the first gain 174. The analog result 184 represents a measure of the quantization error introduced by the comparator 164 and the sampling component 168.

For optimization of the dynamics area, the analog result 184 may be filtered by a low pass filter 186, and if necessary, may be further weakened with a second gain 187 in order to enhance the range of the maximum output signal amplitude of a filtered analog error signal 188. The filtered analog error signal 188 (or the analog result 184) is converted to an intermediate digital signal 192 by an analog-to-digital converter 190. A noise transfer function (NTF) component 194 receives the intermediate digital signal 192 and processes it using a NTF corresponding to the an inverse of complex transfer function H(s) of the loop filter 160 (e.g., such that $NTF=(1+H(z))^{-1}$). Since the complex transfer function H(s) of the signal-shaping component 160 is merely a representative function, it will be appreciated that in alternate embodiments, the NTF of the NTF component 178 may also vary from the representative formulation ($NTF=(1+H(z))^{-1}$) provided above.

Thereafter, a third combiner 198 receives an error correction 196 from the NTF component 194, and the digitized output 172 from the sampling component 168, and combines the error correction 196 and the digitized output 172 to provide a corrected output 199. Since the error correction 196 is the error introduced by the digitization process (comparator 164 and sampling component 168), the corrected output 199 (i.e., PWM-Full-MASH signal) may be virtually free from quantization error. In other words, since the measuring loop 175 measures the error introduced by the entire digitization process (i.e., comparator 164 and sampling component 168) the error correction 196 accounts for possible non-linearities due to quantization by the comparator 164 in a PWM-Full-MASH converter process.

It will be appreciated that the PWM-Full-MASH converter 150 described above is one particular implementation, and that a variety of alternate implementations of electronic components may be conceived in accordance with the teachings of the present disclosure. For example, alternate implementations may be conceived for other types of converters, including non-PWM converters and non-MASH converters. In further implementations, other electronic components that perform digitization may be conceived that incorporate techniques for reducing sampling errors in accordance with the teachings of the present disclosure including, for example, scanning components (e.g., for digitizing photographs, videotape, text, etc.), digital audio components, or any other suitable digitization devices.

Techniques in accordance with the teachings of the present disclosure may provide significant advantages. For example, because the quantization error is measured using the measuring loop 175, it may be assessed and removed from the output signal 199. By compensating for the quantization error, techniques in accordance with the present disclosure may use lower sampling rates without a loss of performance. In addition, techniques in accordance with the present disclosure enable analog to digital converters with very high cancellation which were not practical because of the very high clock speeds that were previously necessary.

Exemplary Process

An exemplary process for reducing quantization errors in accordance with the present disclosure will now be described. For simplicity, the process will be described with reference to the exemplary environment 100 and the exemplary PWM-Full-MASH converter 150 described above with reference to FIGS. 1-2.

Figure 3:
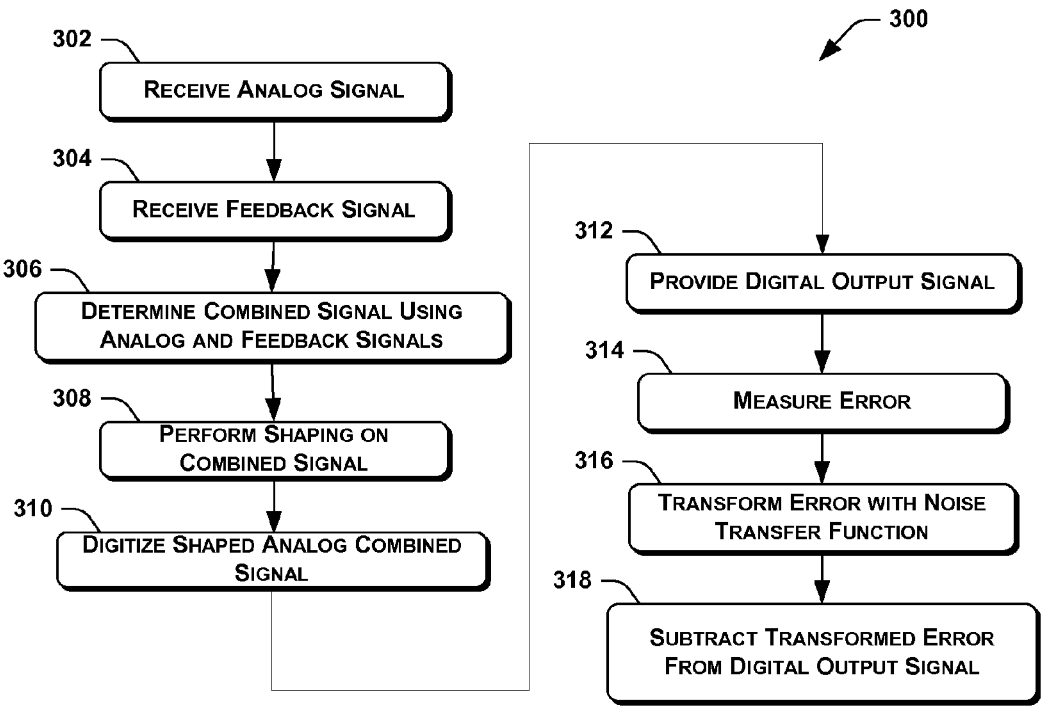
FIG. 3 is a flowchart of a process for reducing sampling noise in accordance with another implementation of the present disclosure.

More specifically FIG. 3 is a flowchart of a process 300 for reducing errors introduced by digitization during an analog-to-digital conversion process in accordance with another implementation of the present disclosure. At 302, an analog signal is received, and a feedback signal is received at 304. A combined signal resulting from a combination (e.g., difference) of the analog and feedback signals is determined at 306, and shaping (e.g., by filtering) is performed on the combined signal at 308.

A shaped analog output resulting from the shaping (at 308) is digitized at 310, and the digitized output signal is provided at 312. For example, in some implementations, the digitization at 310 is performed using a comparator (or other suitable analyzer) and a sampling component. More specifically, in some implementations, the comparator may provide a comparator output which is sampled by the sampling component at the sampling frequency (or $f_{CLK}$).

Figure 4:
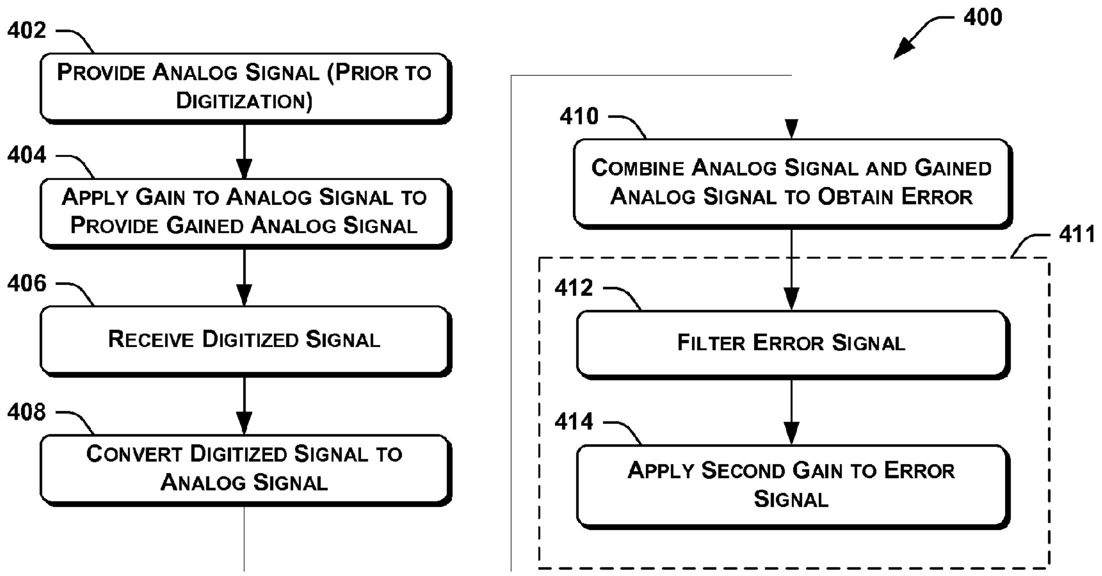
FIG. 4 is a flowchart of a process for measuring an error in accordance with an implementation of the present disclosure.

With continued reference to FIG. 3, at 314 the process 300 measures an error introduced by the process of digitizing the analog signal (at 310-312), including possible non-linearities introduced by a quantizer. The measurement of the error may be performed in any suitable manner. For example, FIG. 4 shows a process 400 for measuring an error in accordance with an implementation of the present disclosure. In this implementation, an analog signal (prior to digitization) is provided at 402. The analog signal may be a shaped signal 162 as described above with reference to FIG. 2. A gain is applied to the analog signal to provide a gained analog signal at 404.

After the analog signal is digitized (i.e. sampled and quantized), the resulting digitized signal is received at 406. In some implementations, the digitization may be accomplished using a comparator 164 and a sampling component 168 as described above with reference to FIG. 2. At 408, a digital-to-analog conversion is performed on the digital signal to provide an intermediate analog signal, and the intermediate analog signal and the gained analog signal are combined (e.g., differenced) to obtain an error signal at 410. The error signal computed at 410 may advantageously include the errors introduced by the entire digitization process (i.e., quantization and sampling errors), and therefore may account for possible non-linearities due to quantization in a PWM-Full-MASH converter process.

In some implementations, additional processing may be desired to improve or optimize the dynamics area of the measured error. For example, in an optional processing portion 411, the error signal may be filtered using a low pass filter at 412, and if necessary, may be further weakened with a second gain at 414 in order to enhance the range of the maximum output signal amplitude of the measured error signal Referring again to FIG. 3, after the error is measured at 314, the measured error is processed or transformed using a noise transfer function at 316. The transformed quantization error is then subtracted from the digital output signal at 318, removing the error from the output signal.

It should be appreciated that the processes 300, 400 are possible implementations of the present disclosure, and that the present disclosure is not limited to the particular implementations described above and shown in FIGS. 3 and 4. For example, in alternate implementations, certain acts need not be performed in the order described, and may be modified, and/or may be omitted entirely, depending on the circumstances. Moreover, in various implementations, the acts described may be implemented by a computer, controller, processor, programmable device, or any other suitable device, and may be based on instructions stored on one or more computer-readable media or otherwise stored or programmed into such devices. In the event that computer-readable media are used, the computer-readable media can be any available media that can be accessed by a device to implement the instructions stored thereon.

Figure 5:
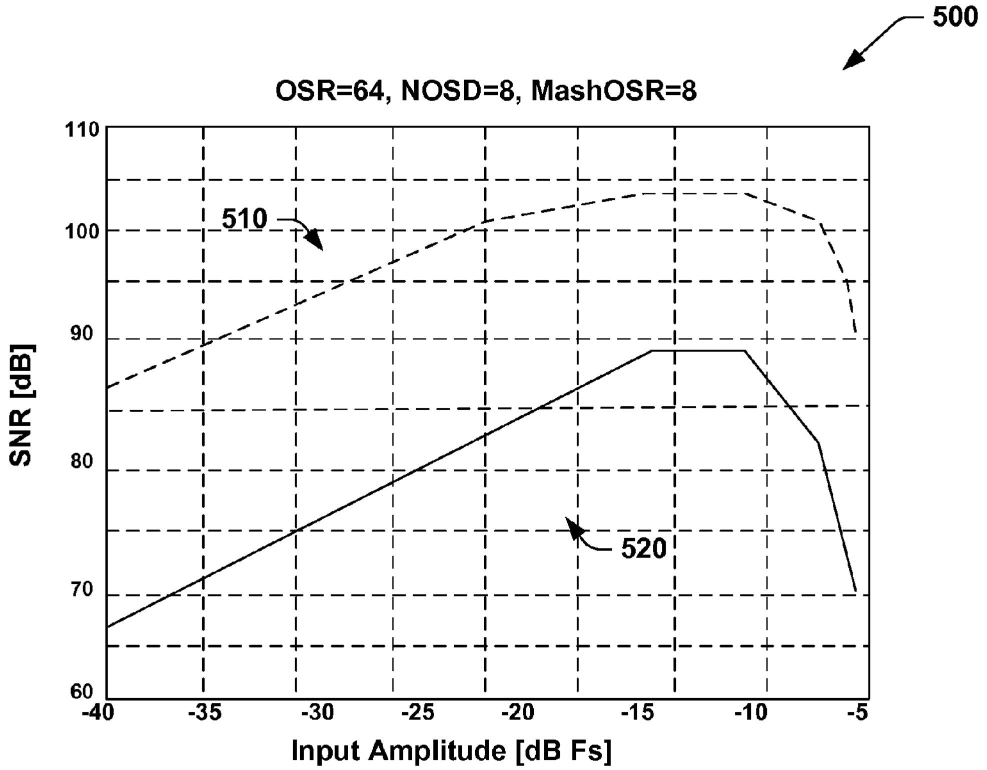
FIG. 5 shows simulation results demonstrating the effectiveness of techniques for reducing digitization error, including quantization noise, in accordance with the present disclosure.

FIG. 5 presents a graph 500 of simulation results demonstrating the effectiveness of techniques for reducing digitization error, including quantization noise, in accordance with the present disclosure. The simulation data shown in FIG. 5 were generated using the Simulink® computer simulation software commercially available from The Mathworks, Inc. of Natick, Mass. More specifically, signal to noise ratio (SNR) is plotted as a function of input amplitude for a PWM-Full-MASH converter having a quantization error correction capability as described above (410), and for a conventional PWM-Full-MASH converter (420). As shown in FIG. 5, the SNR is substantially improved due to the removal of the quantization error in accordance with the teachings of the present disclosure.

Accordingly, techniques in accordance with the present disclosure may advantageously reduce or eliminate noise due to digitization in electronic components, including quantization errors in PWM-Full-MASH converters. The elimination of quantization noise advantageously allows such electronic components to operate effectively at reduced sampling rates, with corresponding reductions in power consumption. The area of dynamics of such electronic components is decisively enhanced and the maximum output signal amplitude is also improved. In addition, surface area requirements and fabrication costs for MASH filters may be reduced in comparison with conventional electronic components. Implementations in accordance with the present disclosure may allow analog-to-digital converters to operate with very high dissolution which have been virtually unrealizable up to now.

CONCLUSION

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

We claim:

1. A circuit, comprising:
- a digitization portion coupled to receive a shaped signal and to provide a digitized output; and
- an error determination portion coupled to the digitization portion, the error determination portion including:
  - a digital-to-analog converter configured to convert the digitized output to an intermediate analog signal;
  - a first combiner configured to determine an error based on a combination of a gained signal and the intermediate analog signal;
  - an analog-to-digital converter configured to convert the combination of the gained signal and the intermediate analog signal to an intermediate digital signal; and
  - a noise transfer function component configured to apply a noise transfer function to the intermediate digital signal to provide a transformed error, the transformed error being combined with the digitized output to provide a corrected digital output.

2. The circuit as recited in claim 1, wherein the digitization portion includes:
- an analyzer coupled to receive the shaped signal and to provide an analyzer output having one of a first value and a second value, the analyzer output having the first value when the shaped signal is within a first range, and the analyzer output having the second value when the shaped signal is within a second range; and
- a sampling component coupled to receive the analyzer output and a clock signal, and to provide the digitized output based on the clock signal.

3. The circuit as recited in claim 2, wherein the analyzer comprises a comparator.

4. The circuit as recited in claim 1, further comprising a shaping component to provide the shaped signal, and wherein the shaping component is characterized by a complex transfer function, and wherein the noise transfer function is an inverse transformation of the complex transfer function.

5. The circuit as recited in claim 1, wherein the error determination portion further includes:
- a low pass filter configured to filter the combination of the gained signal and the intermediate analog signal, and
- a second gain component configured to apply a second gain to an output from the low pass filter prior to conversion by the analog-to-digital converter.

6. The circuit as recited in claim 1, further comprising a second combiner configured to combine the digitized output with an initial input signal to provide an analog input signal.

7. The circuit as recited in claim 1, further comprising a shaping component to provide the shaped signal, the shaping component having at least one of a filter and a multi-stage noise shaping component.

8. An electronic device, comprising:
- a processor; and
- a communication component operatively coupled to the processor and configured to at least one of receive and transmit communication signals, the communication component including a modulator component having:
  - a digitization portion coupled to receive a shaped signal and to provide a digitized output; and
  - an error determination portion coupled to the digitization portion, the error determination portion including:
  - a digital-to-analog converter configured to convert the digitized output to an intermediate analog signal;
  - a first combiner configured to determine an error based on a combination of a gained signal and the intermediate analog signal;
  - an analog-to-digital converter configured to convert the combination of the gained signal and the intermediate analog signal to an intermediate digital signal; and
  - a noise transfer function component configured to apply a noise transfer function to the intermediate digital signal to provide a transformed error, the transformed error being combined with the digitized output to provide a corrected digital output.

9. The electronic device as recited in claim 8, wherein the digitization portion includes:

an analyzer coupled to receive the shaped signal and to provide an analyzer output having one of a first value and a second value, the analyzer output having the first value when the shaped signal is within a first range, and the analyzer output having the second value when the shaped signal is within a second range; and a sampling component coupled to receive the analyzer output and a clock signal, and to provide the digitized output based on the clock signal.

10. The electronic device as recited in claim 8, wherein the error determination portion further includes:

a low pass filter configured to filter the combination of the gained signal and the intermediate analog signal, and a second gain component configured to apply a second gain to an output from the low pass filter prior to conversion by the analog-to-digital converter.

11. The electronic device as recited in claim 8, further comprising a shaping component, the shaping component having at least one of a filter, and a multi-stage noise shaping component.

12. A method, comprising:

digitizing a shaped signal to provide a digitized signal;

applying a gain to the shaped signal to provide a gained signal;

converting the digitized signal to an intermediate analog signal;

determining an error based on a combination of the gained signal and the intermediate analog signal;

converting the combination of the gained signal and the intermediate analog signal to an intermediate digital signal; and applying a noise transfer function to the intermediate digital signal to provide a transformed error, the transformed error being combined with the digitized signal to provide a corrected digital output.

13. The method as recited in claim 12, wherein digitizing the shaped signal includes:

analyzing the shaped signal;

providing an analyzer output having one of a first value and a second value, the analyzer output having the first value when the shaped signal is within a first range, and the analyzer output having the second value when the shaped signal is within a second range; and p1 sampling the analyzer output at a clock frequency to provide the digitized signal.

14. The method as recited in claim 12, wherein determining the error further includes:

low-pass filtering the combination of the gained signal and the intermediate analog signal, and applying a second gain to an output from the low-pass filtering prior to conversion to the intermediate digital signal.

* * * * *